(12) United States Patent
Umeda

(10) Patent No.: US 6,384,399 B1
(45) Date of Patent: May 7, 2002

(54) OPTICAL RECEIVING CIRCUIT COMPRISING A REFLECTION COEFFICIENT SETTING CIRCUIT

(75) Inventor: Toshiyuki Umeda, Inagi (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/327,682

(22) Filed: Jun. 8, 1999

(30) Foreign Application Priority Data

Jun. 9, 1998 (JP) ............................................ 10-160572

(51) Int. Cl.$^7$ ............................ H01J 40/14; H03F 17/00
(52) U.S. Cl. ...................... 250/214 A; 330/59; 330/302
(58) Field of Search ......................... 250/214 A, 214 R, 250/214 LA, 214 AG, 214 C; 330/59, 110, 277, 286, 293, 302, 303, 306; 327/514

(56) References Cited

U.S. PATENT DOCUMENTS 4,952,795 A * 8/1990 Gauthier et al. ......... 250/214 A
5,159,287 A * 10/1992 Furutani et al. ............. 330/302
5,565,672 A * 10/1996 Siegel et al. ............ 250/214 A

OTHER PUBLICATIONS

P.R. Gray, et al., Analysis and Design of Analog Integrated Circuits, Third Edition, pp. 193–194, Fig. 3.1, "Single–Transistor and Two–Transistor Amplifiers", 1993.*

R.G. Meyer, et al., IEEE Journal of Solid–State Circuits, vol. SC–21, No. 4, pp. 530–533, "A Wide–Band Low Noise Monolithic Transimpedance Amplifier", Aug. 1986.*

* cited by examiner

*Primary Examiner*—Kevin Pyo
(74) *Attorney, Agent, or Firm*—Oblon, Spivak, McClelland, Maier & Neustadt, P.C.

(57) ABSTRACT

An object of the present invention is to provide an optical receiving circuit that it is possible to even a gain during a broad frequency band. The optical receiving circuit according to the present invention comprises an amplifier for feeding back negatively and amplifying an input signal, and a reflection coefficient setting circuit for setting an input reflection coefficient of the amplifier. For example, the reflection coefficient setting circuit has a resister Rin. One end of the resistor Rin is connected to an input terminal of the amplifier, and the other end of the resistor Rin is supplied with a voltage Vin substantially equal to a direct-current component of an input signal IN. The resistance of the resistor Rin is set so that the input reflection efficient becomes about less than about 0.3. Therefore, a peaking does not occur even at a resonance point, and it is possible to even a gain during a broad frequency band.

20 Claims, 7 Drawing Sheets

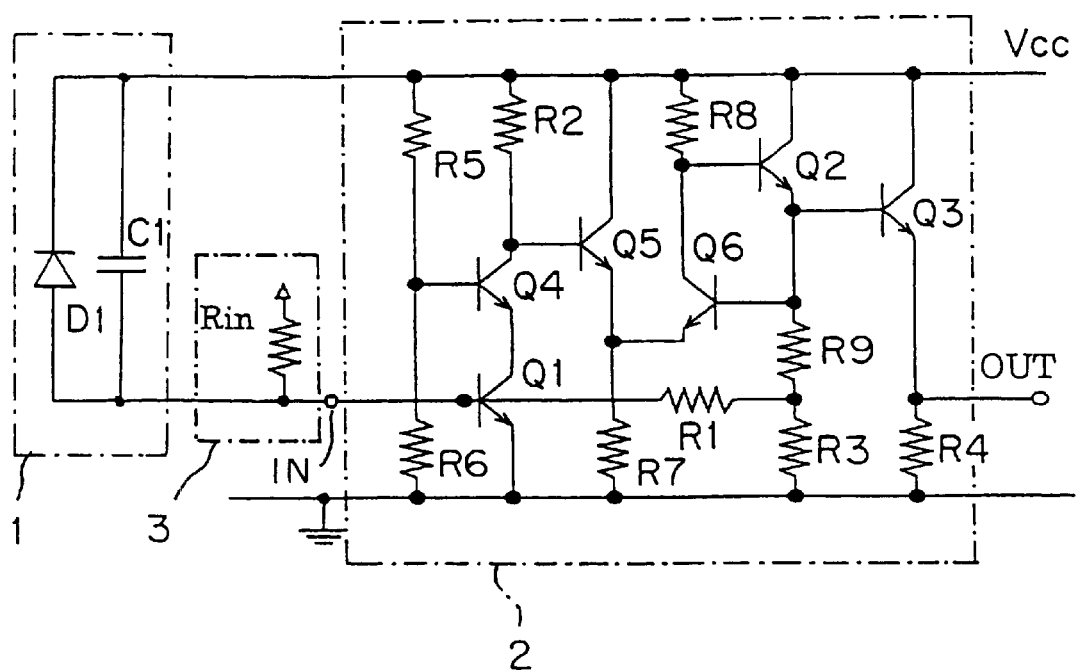
F I G. 1

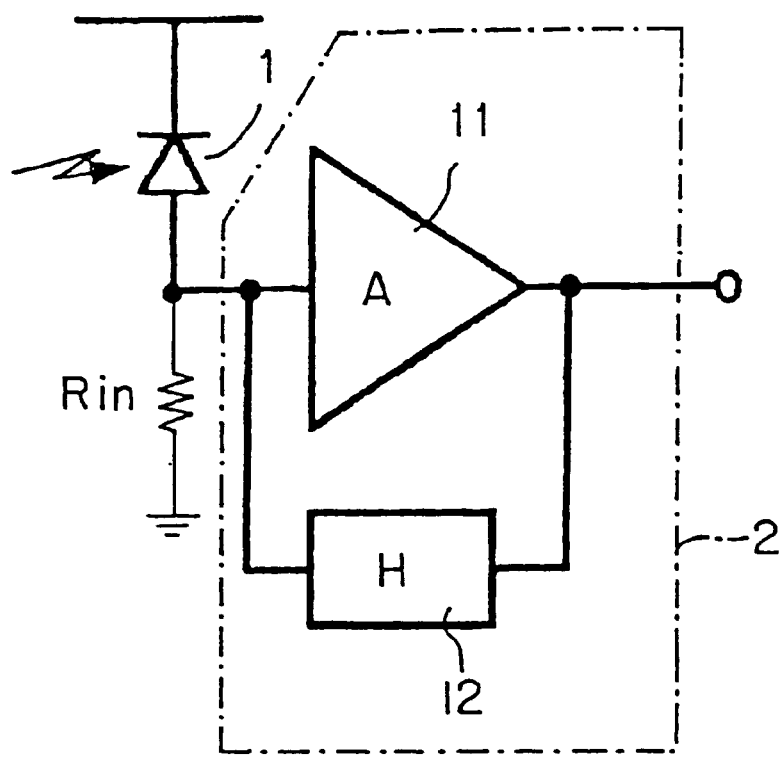
F I G. 2
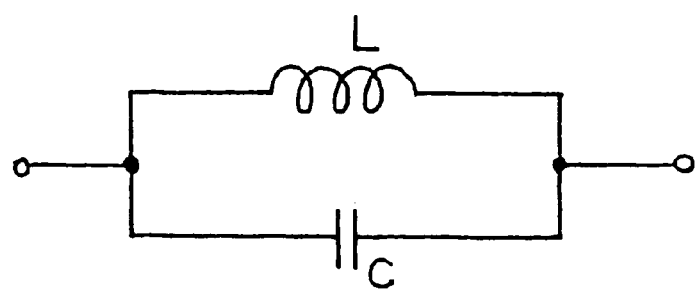
F I G. 3

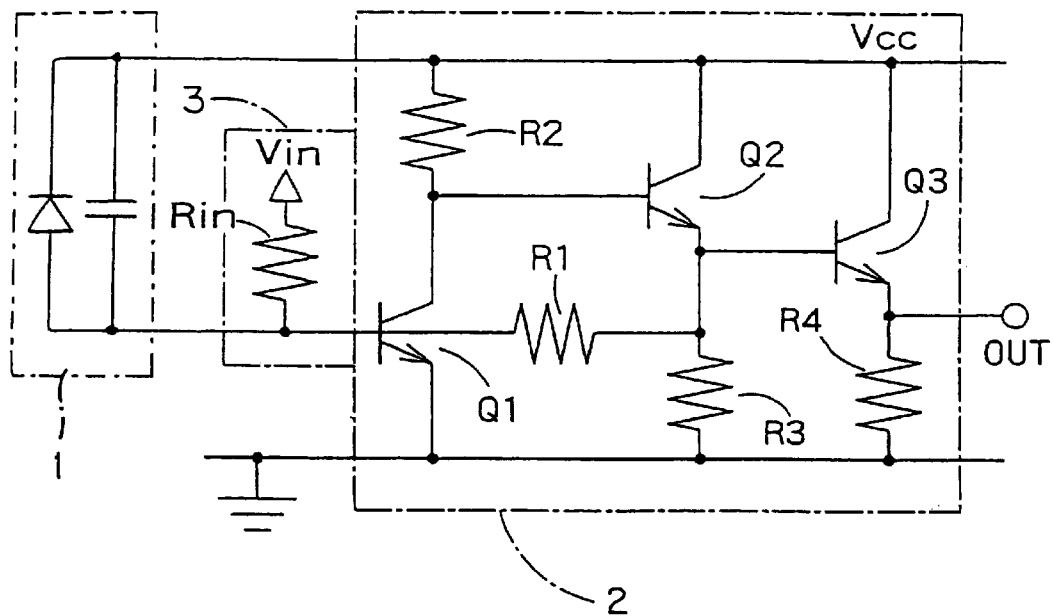
F I G. 6
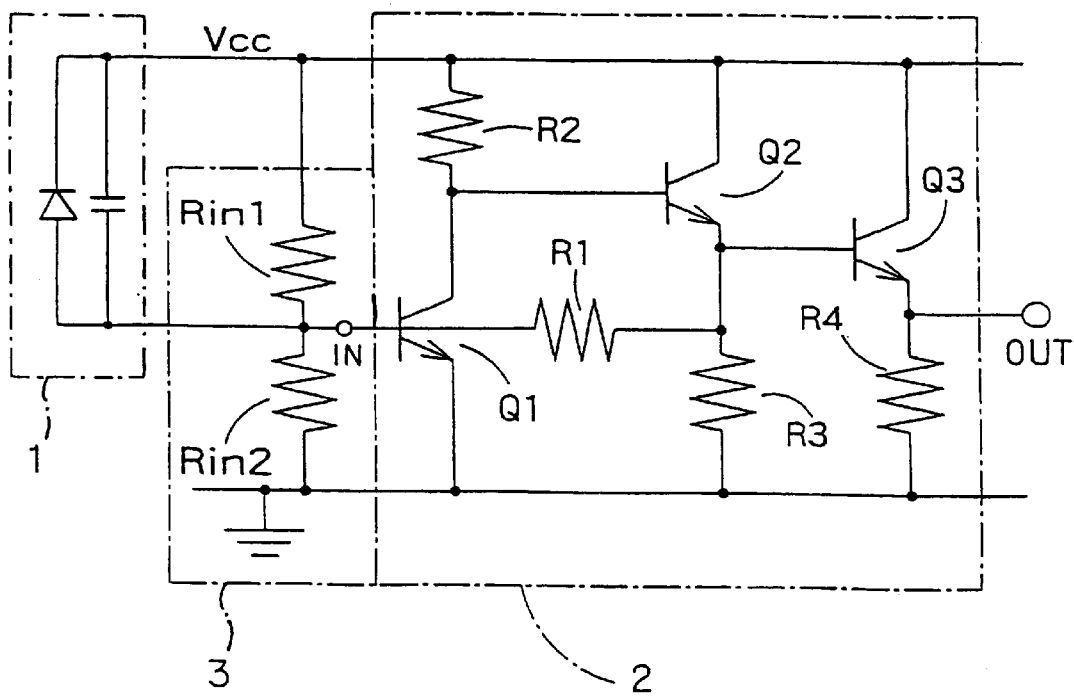
F I G. 7

OPTICAL RECEIVING CIRCUIT COMPRISING A REFLECTION COEFFICIENT SETTING CIRCUIT

BACKGROUND OF THE INVENTION

1. Field of the Invention

The present invention relates to a circuit which negatively feeds back and amplifies after carrying out photoelectric conversion. Especially, the present invention aims at a circuit which converts to a voltage signal a current signal outputted from a photo-diode and so on.

2. Related Background Art

A photo-diode (PD) outputs a current signal converted from a light receiving optical signal. Because the current signal outputted from the photo-diode is feeble, it is general to convert the current signal into a voltage signal and then to amplify the voltage signal. Such a current-voltage conversion circuit is generally called a trans-impedance amplifier (TIA).

FIG. 13 is a block diagram showing a schematic configuration of a conventional optical receiving circuit having the photo-diode 51 and the trans-impedance amplifier 52. A current signal converted by the photo-diode 51 of FIG. 13 is inputted to the trans-impedance amplifier 52 and then converted to the voltage signal, The trans-impedance amplifier 52 is constituted by an amplifier 53 and an attenuation circuit 54. An output of the amplifier 53 is fed back to an input side of the amplifier 53 via the attenuation circuit 54.

The photo-diode 51 is formed of a manufacturing process different from that of the trans-impedance amplifier 52. Because of this, the photo-diode 51 and trans-impedance amplifier 52 are separately formed of processes different from each other, and then both are connected electrically by using bonding wires and so on, and finally packaged.

A system transferring a large amount of data such as more than gigabit per second is constituted so as to derive element properties of the photo-diode 51 and the trans-impedance amplifier 52 at the most. For example, a number of transistors connected in series are provided in the inside of the trans-impedance amplifier 52. Therefore, an improvement of the element property such as an increase of an open loop gain is performed.

However, the open loop gain decreases as a frequency becomes higher. In accordance with decrease of the open loop gain, an input impedance of the trans-impedance amplifier 52 increases. Due to the impedance and an input capacitance of the trans-impedance amplifier 52, a reflection coefficient has a resonance point. At the point, a current-voltage conversion gain increases, and a gain fluctuation occurs in a used frequency band, resulting in an aggravation of electrical property.

On a packaged condition, when a voltage-to-ground capacitance, which is a determinant of a parasitic component of the photo-diode 51, parasitizes the input terminal of the trans-impedance amplifier 52, an output property of the trans-impedance amplifier 52, i.e. a gain at high-frequency band deteriorates, as a value of the voltage-to-ground capacitance becomes large. Bonding wires connecting the photo-diode 51 to the trans-impedance amplifier 52 add a parasite inductance at an input portion of the trans-impedance 52. As a result, a gain deviation and a group delay deviation become large at a high-frequency band.

SUMMARY OF THE INVENTION

An object of the present invention is to provide an optical receiving circuit that it is possible to even a gain in a broad frequency band.

In order to achieve the foregoing object, an optical receiving circuit, comprising:
- a photoelectric conversion element for outputting a current signal in accordance with a light receiving optical signal;
- a negative feedback type of an amplifier in which said current signal is inputted, said amplifier outputting a voltage in accordance with the current signal, and
- a reflection coefficient setting circuit for setting an input reflection coefficient, said reflection coefficient setting circuit being provided between said photoelectric conversion element and said amplifier.

Furthermore, an optical receiving circuit, comprising:
- a photoelectric conversion element for outputting a current signal in accordance with a light receiving optical signal;
- a negative feedback type of an amplifier in which said current signal is inputted, said amplifier outputting a voltage in accordance with said current signal, and
- a reflection coefficient setting circuit for setting an input reflection coefficient, said reflection coefficient setting circuit being provided between said photoelectric conversion element and said amplifier;
- wherein said reflection coefficient setting circuit minifies the input reflection coefficient at a sympathetic vibrating frequency and evens a frequency dependency of a gain of said amplifier.

Furthermore, an optical receiving circuit, comprising:
- a photoelectric conversion element for outputting a current signal in accordance with a light receiving optical signal;
- a negative feedback type of an amplifier in which said current signal is inputted, said amplifier outputting a voltage in accordance with said current signal;
- a reflection coefficient setting circuit for setting an input reflection coefficient, said reflection coefficient setting circuit being provided between said photoelectric conversion element and said amplifier; and
- a plurality of bonding wires for connecting between said photoelectric conversion element and said reflection coefficient setting circuit, and between said reflection coefficient setting circuit and said amplifier, respectively.

According to the present invention, when the input impedance of a negative feedback type of the amplifier, that is, the input reflection coefficient of a sympathetic vibrating circuit equivalent to the amplifier coincides with a resonance point, a control is performed so that an absolute value of the input reflection coefficient of the amplifier becomes small. As a result, it is possible to even the gain in a broad frequency band.

Furthermore, when mounting the photoelectric conversion element and the amplifier in the same substrate, the current voltage converter sympathetically vibrates at a plurality of frequencies different from each other in the used frequency band, by using a parasite capacitance of the photoelectric conversion element, a parasite inductance of the bonding wires connecting the photoelectric conversion element and the amplifier and so on. Because of this, even if a passing S parameter S11 decreases at a high-frequency band, it is possible to cancel the decreased amount by enlarging the input reflection coefficient S11. As a result, during a broad frequency band, the gain is evened and the used frequency band is extended.

BRIEF DESCRIPTION OF THE DRAWINGS

FIG. 1 is a circuit diagram of a first embodiment of an optical receiving circuit according to the present invention;

FIG. 2 is an equivalent circuit diagram of the optical receiving circuit of FIG. 1;

FIG. 3 is an equivalent circuit diagram of an input impedance of an amplifier;

FIG. 6 is a circuit diagram of a second embodiment of an optical receiving circuit according to the present invention;

FIG. 7 is a circuit diagram of a third embodiment of an optical receiving circuit according to the present invention;

DESCRIPTION OF THE PREFERRED EMBODIMENTS

Figure 4:
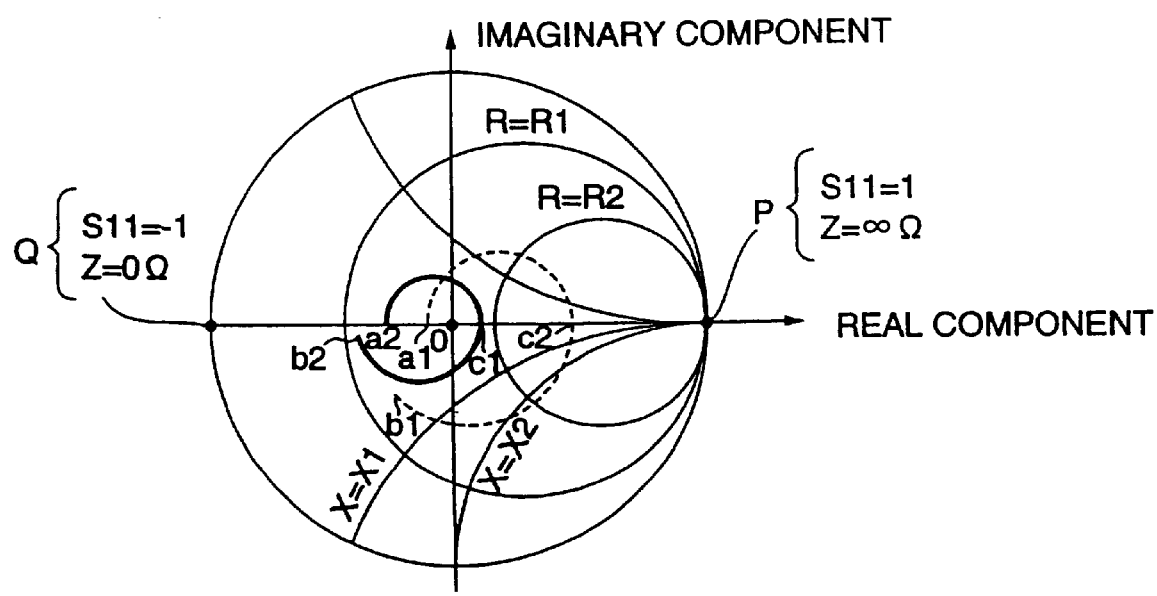
FIG. 4 is a Smith chart expressing a property of a circuit of FIG. 1.

An optical receiving circuit according to the present invention is described in detail with reference to the attached drawings as follows.

(First embodiment)

FIG. 1 is a circuit diagram of a first embodiment of an optical receiving circuit according to the present invention. The optical receiving circuit of FIG. 1 comprises an photo-electric conversion element 1 for outputting a current signal in accordance with a light receiving optical signal, a negative feedback type of an amplifier 2 for outputting a voltage in accordance with the current signal, and a reflection coefficient setting circuit 3 for setting an input reflection coefficient of the amplifier 2.

The reflection coefficient setting circuit 3 has a resistor Rin. One end of the resistor Rin is connected to an input terminal of the amplifier 2. A voltage Vin equal to a direct-current component of the input signal IN of the amplifier 2 is applied to the other end of the resistor Rin.

The amplifier 2 has transistors Q1–Q6 and resistors R1–R8. The transistor Q4, which constitutes a cascode amplifier with the transistor Q1, is connected to a collector terminal of the transistor Q1 which is an emitter-grounded circuit and carries out an amplification operation. A voltage dividing a power supply voltage Vcc by the resistors R5 and R6 is applied to a base terminal of the transistor Q4.

An emitter follower circuit constituted by the transistor Q5 and the resistor R7 is connected to a collector terminal of the transistor Q4. The transistor Q6, which performs the amplification operation, is connected to an emitter terminal of the transistor Q5. The resistor R8, and an emitter follower circuit constituted by the transistor Q2 and the resistor R3 and R9 are connected to a collector terminal of the transistor Q6. An emitter follower circuit constituted by the transistor Q3 and the resistor R4 is connected to an emitter terminal of the transistor Q2. A feedback resistor R1 is connected between a connecting point of the resistors R3, R9 and a base terminal of the transistor Q1.

The optical receiving circuit of FIG. 1 can express by an equivalent circuit shown in FIG. 2. The amplifier of FIG. 1 corresponds to an amplifier 11 and an attenuation circuit 12 of FIG. 2. More specifically, the resistor R1 of FIG. 1 corresponds to the attenuation circuit 12 of FIG. 2, and all the constituents in the negative feedback amplifier 2 except for the resistor R1 corresponds to the amplifier 11 of FIG. 2.

Next, prior to a description of behaviors of the optical receiving circuit of FIG. 1, an operating principle according to the first embodiment is explained below in detail with reference to FIG. 2.

Properties with a broad frequency band and high-gain are required of a front end IC for an optical communication. It is desirable to adopt a negative feedback circuit in order to broaden the frequency band, and it is desirable to enlarge both of an open loop gain of the amplifier 11 and an impedance of the attenuation circuit 12 in order to obtain high-gain.

The amplifier 2, that is, an input impedance Zin of a trans-impedance circuit is expressed by (1) equation.

$$Zin = \frac{r0}{1 + AH} \quad (1)$$

Where "r0" is an open loop input impedance of the amplifier 11, "A" is the open loop gain, and "H" is a feedback ratio. A frequency property of "A" is expressed by (2) equation.

$$A = \frac{gmoR_L}{1 + j\frac{\omega}{\omega_c}} \quad (2)$$

Here, "gmo" is a trans-conductance value of a transistor for amplitude in a direct-current, "$R_L$" is a load resistor, ω is an angular frequency, ωc is a breaking angular frequency. As understood from (2) equation, the open loop gain "A" decreases in accordance with the frequency. Accordingly, the input impedance Zin increases as the frequency becomes high. When simplifying this property, Zin corresponds to an inductor L.

On the other hand, an input capacitor C such as a capacitor of a transistor is added to an input portion of the amplifier. Accordingly, if simplifying the input impedance of the amplifier (trans-impedance amplifier) 2 by an equivalent circuit, as shown in FIG. 3, it is possible to express by a sympathetic vibrating circuit consisted of an inductor L and a capacitor C. The sympathetic vibrating frequency f of the sympathetic vibrating circuit is expressed by (3) equation.

$$f = \frac{1}{2\pi\sqrt{LC}} \quad (3)$$

The input impedance of the amplifier 2 becomes infinite at a sympathetic vibrating frequency.

Incidentally, a current-voltage conversion gain Zt of the amplifier 2 is expressed by (4) equation.

$$Zt = \frac{S_{21} \cdot Z_o}{1 - S11} \quad (4)$$

Here, Zo is a standardized impedance, S11 is an input reflection S parameter, and S21 is a forward direction S parameter. A relation of (5) equation is established between S11 and Z11.

$$S11 = \frac{Zin - Zo}{Zin + Zo} \quad (5)$$

With reference to the relations described above, at the sympathetic vibrating frequency, Zin becomes infinite from (3) equations, and S11=1 from (5) equation, and Zt has an infinite gain from (4) equation. That is, even if the forward direction gain S21 is a constant value in the used frequency band, a value of Zt changes on a large scale by a value of S11, i.e., a property that a gain fluctuation is large is obtained.

It is desirable for the amplifier 2 that the current-voltage conversion gain Zt is constant in the used frequency band. Accordingly, when a resonance point exists in the input impedance of the amplifier 2 in the used frequency band, it is necessary to suppress a fluctuation of the current-voltage conversion gain Zt by setting the reflection coefficient at a resonance point to a small value.

Because of this, the present embodiment provides the reflection coefficient setting circuit 3 as shown in FIG. 1, and connects the resistor Rin to the input terminal in parallel in order to minify an absolute value of S11 at the resonance point.

FIG. 4 is a Smith chart showing a property of the circuit of FIG. 1. The Smith chart of FIG. 4 separates the input reflection coefficient and an normalized impedance into a real component (horizontal axis) and an imaginary component (vertical axis). A center "O" of an outer circle shows a point that the input reflection coefficient is zero, a "P" at right end of the outer circle shows a point that the input coefficient is "1", and a "Q" at left end of the outer circle shows a point that the input coefficient is "−1". Inner circles shows constant resistance circles, respectively.

A locus of a dotted line in FIG. 4 shows the input reflection property of the conventional optical receiving circuit, and a locus of a bold solid line shows the input reflection property of the optical receiving circuit according to the present invention (FIG. 1). These loci are obtained when the frequency is changed in a range of 0–10 GHz. The points "a1" and "a2" correspond to the frequency f=0 Hz, the points "b1" to f=10 GHz. Cross points "c1" and "c2" between each locus and the horizontal axis show the resonance point. A distance between the resonance points c1, c2 and the center O of the outer circle shows an absolute value of the input reflection coefficient.

As understood from FIG. 4, by adding the resistor Rin of FIG. 1, all the loci move to a left side, and diameters of the loci become small thereby. The amount of the movement of the loci to the left side depends on a resistance value of the resistor Rin of FIG. 1.

When the input reflection coefficient (input reflection S parameter) S11 at the resonance point is equal to or less than about 0.3, as shown in (4) equation, a gain fluctuation in the used frequency band is reduced less than 3 dB. Because of this, the first embodiment sets a resistance of the resistor Rin so that the input reflection coefficient S11 at the resonance point becomes equal to or less than about 0.3.

More specifically, the resistance of the resistor Rin is set to about 50–200Ω. It is desirable to set the resistance of the resistor Rin based on a measuring result after forming the circuit. The bold solid locus of FIG. 4 shows a result in case of setting the resistance of the resistor Rin so that the input reflection coefficient S11 at the resonance point become equal to or less than about 0.3.

Figure 5:
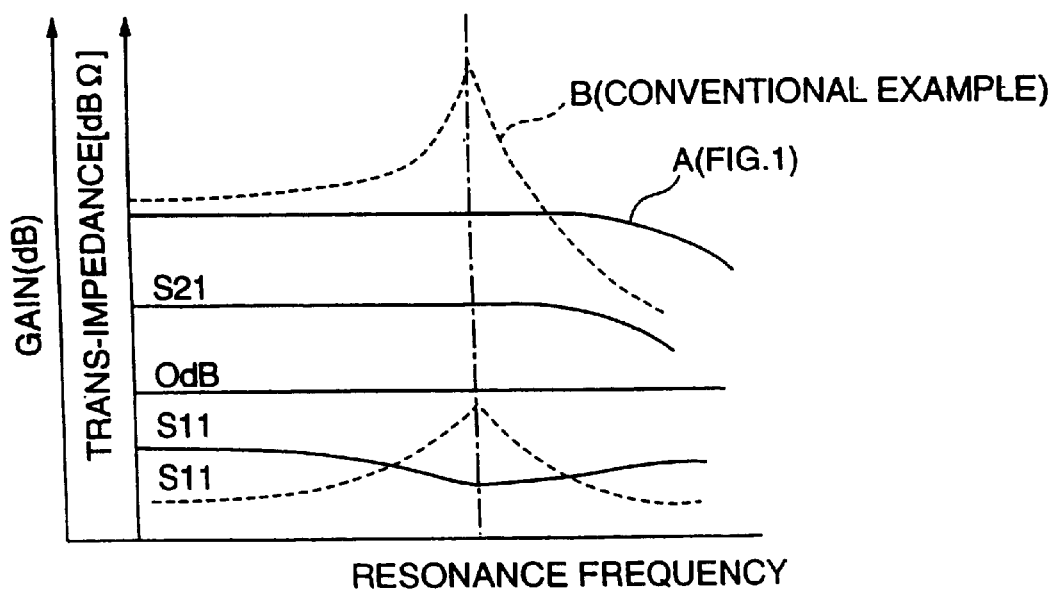
FIG. 5 is a diagram showing an appearance that a current-voltage conversion gain of the optical receiving circuit of FIG. 1 changes in accordance with frequencies.

FIG. 5 is a diagram showing an appearance that the current-voltage conversion gain of the optical receiving circuit changes in accordance with the frequency. The solid line "A" of FIG. 5 shows a property of the present embodiment, and the dotted line "B" shows a property of a conventional circuit. Whereas a peaking has occurred at the resonance point in the conventional circuit, the gain Zt does not fluctuate even at the resonance point in the present embodiment. That is, according to the present embodiment, a property which is even and has no peaking during the broad frequency band is obtained.

Thus, the first embodiment connects the resistor Rin for setting the input reflection coefficient to the input terminal of the amplifier 2, and sets the resistance of the resistor Rin so that the input reflection coefficient S11 becomes small at the resonance point of the amplifier 2. Because of this, the peaking does not occur even at the resonance point, and it is possible to even the gain during the broad frequency band.

FIG. 5 shows an example that the gain of the present embodiment is smaller than that of the conventional circuit. However, if the resistance of the feedback resistor R1 is set large, for example more than 1 kΩ, the gain equal to or more than the conventional circuit is obtained.

On the other hand, when enlarging the resistance of the feedback resistor R1 and raising the gain of the amplifier 2, the sympathetic vibrating frequency lowers thereby. Because of this, there is a likeliness that the frequency band in which the gain is even becomes narrow. However, in the present embodiment, because the reflection coefficient at the sympathetic vibrating frequency is set small, the peaking does not occur at the resonance point; as a result, it is possible to broaden a frequency band that the gain is even. That is, according to the present embodiment, it is possible to realize the optical receiving circuit having a broad frequency band and a high-gain.

(Second Embodiment)

A second embodiment has a feature in which a circuit configuration is easier than that of the first embodiment.

FIG. 6 is a circuit diagram of a second embodiment of an optical receiving circuit according to the present invention. In FIG. 6, the same figures are attached to the same constituents as those of FIG. 1. Hereinafter, points different from the first embodiment will be mainly explained.

A amplifier 2 in FIG. 6 performs an amplifying operation only in a transistor Q1. The transistor Q2 and the resistor R3 which constitutes an emitter follower circuit is connected to a collector terminal of the transistor Q1. To subsequent stage, the transistors Q3 and Q4, which constitutes the emitter follower circuit in same way, are connected. The resistor R1 is a feedback resistor.

Even in the circuit of FIG. 6, because a resistor Rin for setting a reflection coefficient is connected to an input stage of the amplifier 2, the same advantageous effect as that of the first embodiment is obtained.

The amplifier 2 of the second embodiment carries out the amplifying operation. Because of this, the transistor Q1 which fills the following three conditions is used.

(1) A current amplification ratio β is large.
(2) A conductance gm is large
(3) An input resistance R0 of the transistor Q1 is small.

(Third Embodiment)

The third embodiment has a feature in which resisters are connected between a power supply terminal and an input terminal, and between the input terminal and a ground terminal, respectively.

FIG. 7 is a circuit diagram of a third embodiment of an optical receiving circuit according to the present invention. The optical receiving circuit of FIG. 7 comprises a resistor Rin1 connected between a power supply terminal Vcc and an input terminal "In" of the amplifier 2, and a resistor Rin2 connected between the input terminal IN and a ground terminal.

It is possible to minify an absolute value of S11, which is shown in (3) equation, at a resonance point. More specifically, the resistances of the resistors Rin1 and Rin2 are set so that the input reflection coefficient (input reflection S parameter) becomes equal to or less than about 0.3.

Therefore, even in the third embodiment, the peaking at the resonance point does not occur. As a result, it is possible to even the gain during a broad frequency band.

Furthermore, according to the third embodiment, it is unnecessary to input a voltage substantially equal to a direct-current component of the input signal IN to the circuit of FIG. 7, unlike the first embodiment. Because of this, a circuit generating such a voltage is unnecessary. As a result, it is possible to simplify a circuit configuration.

Although the circuit of FIG. 7 carries out amplifying operation by one stage of a transistor, amplifying operation may be carried out by using more than two stages of transistors.

(Fourth Embodiment)

The fourth embodiment has a feature in which a photo-electric conversion element, that is, a photo-diode (PD), and an amplifier, that is, a trans-impedance amplifier (TIA) are mounted on an optical receiving module substrate.

Figure 8:
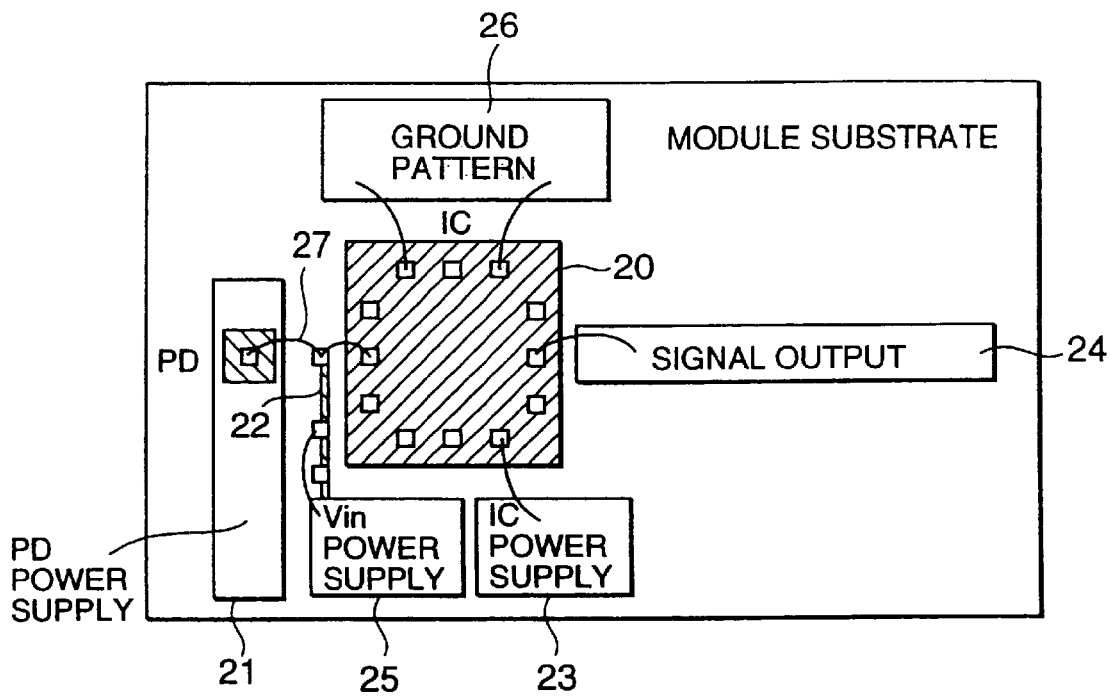
FIG. 8 is a layout diagram showing a condition mounting the circuit of FIG. 1 on a module substrate.

FIG. 8 is a layout diagram showing an example mounting the circuit of FIG. 1 on the module substrate. On the module substrate of FIG. 8, an IC 20, in which a negative feedback type of an amplifier 2 is included, is mounted. Furthermore, a power supply pattern 21 for a photo-diode PD (a photo-electric conversion element 1 of FIG. 1), a narrow pattern 22 for the reflection coefficient setting circuit 3, an IC power supply pattern for the IC 20, a signal output pattern 24 that a signal outputted from the IC 20 passes through, a Vin pattern 25 for supplying a voltage substantially equal to a direct-current component of the input signal IN of the IC 20, and a ground pattern 26 are formed on the module substrate.

The photo-diode PD is formed a portion of the power supply pattern 21. The resistor Rin constituting the reflection coefficient setting circuit 3 is formed of the narrow pattern 22. One end of the narrow pattern 22 is connected to a photo-diode and an input terminal of the IC 20 via bonding wires 27. The other end of the narrow pattern 22 is connected to the Vin pattern 25.

A power supply terminal in the IC 20 is connected to the IC power supply pattern 23 via the bonding wire 27, and a ground terminal in the IC 20 is connected to the ground pattern 26 via the bonding wire 27.

Figure 9:
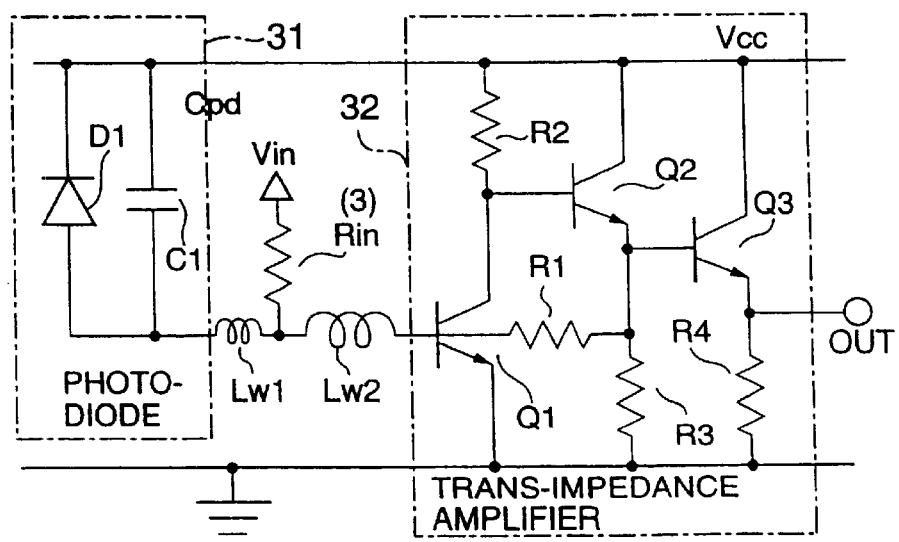
FIG. 9 is an equivalent circuit diagram of an optical receiving circuit of FIG. 8.

FIG. 9 is an equivalent circuit of the optical receiving circuit of FIG. 8. As shown in FIG. 9, the photo-diode 31 is equivalently expressed a diode 31 and a parasite capacitor C1 connected in parallel, alike the photoelectric conversion element 1 of FIG. 1. The trans-impedance amplifier 32 is constituted alike the amplifier 2 shown in FIG. 1. The bonding wires 27 are equivalently expressed parasite inductors Lw1 and Lw2.

The resistance of the resistor Rin connected between the bonding wires 27 is set so that the input reflection coefficient S11 becomes equal to or less than 0.3 at the minimum mode of a resonance point. More specifically, the resistance of about 50–200Ω is selected.

Figure 10:
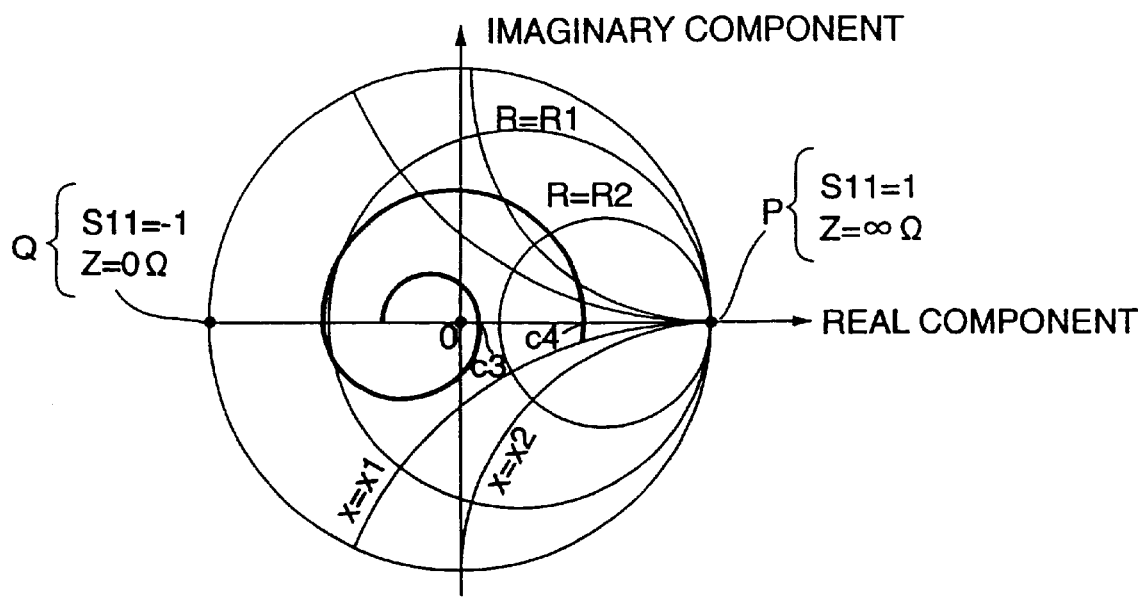
FIG. 10 is a Smith chart expressing a property of the circuit of FIG. 5.

FIG. 10 is a Smith chart showing a property of the circuit of FIG. 9. A locus of a bold solid line in FIG. 10 expresses a property of the fourth embodiment. Cross points C3 and C4 between the locus and a horizontal axis correspond to the resonance points. The amount of movement to a left side of the locus is prescribed by a resistance of the resistor Rin alike the first embodiment. A diameter of the locus is prescribed by a capacitance of the parasite capacitor C1 and an inductance of the parasite inductors Lw1 and Lw2 by the bonding wires in FIG. 9.

Conventionally, because the parasite capacitor C1 and the parasite inductors Lw1 and Lw2 allow a property of the trans-impedance amplifier 32 to deteriorate, it was general to remove the parasite C1 and the parasite inductors Lw1 and Lw2 as much as possible. Conversely, the fourth embodiment has a feature in which the parasite capacitor C1 and the parasite inductors Lw1 and Lw2 are positively used in order to allow the property of the trans-impedance amplifier 32 to improve.

That is, by adding the parasite capacitor C1 and the parasite inductors Lw1 and Lw2 to the circuit, the amount of phase rotation of the input reflection S parameter S11 is quickened. As a result, the parallel resonance occurs at a plurality of points in the used frequency band. More specifically, the sympathetic vibration occurs at two frequencies of points C3 and C4.

Figure 11:
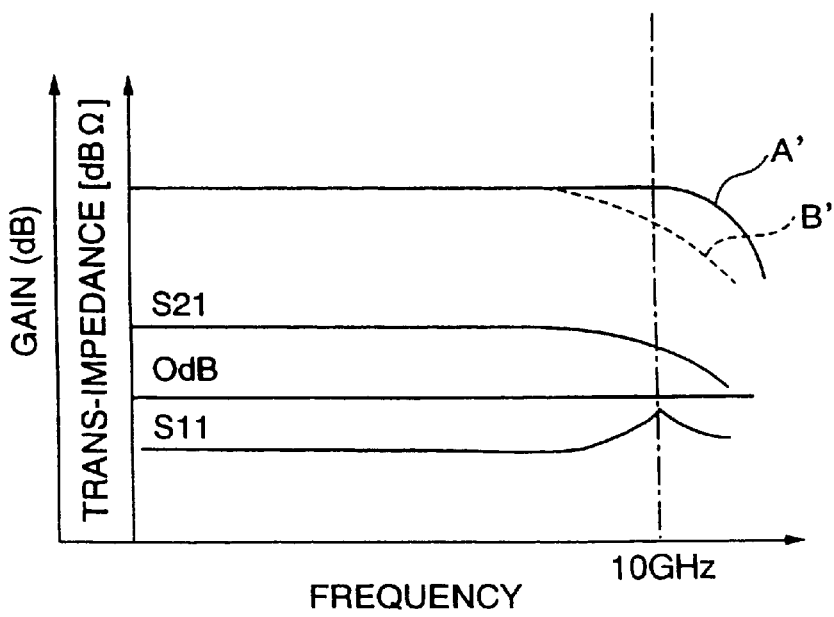
FIG. 11 is a diagram showing an appearance that a current-voltage conversion gain of the optical receiving circuit of FIG. 9 changes in accordance with frequencies.

FIG. 11 is a diagram showing an appearance that a loop gain of the optical receiving circuit changes in accordance with frequencies. The solid line "A'" shows a property of the circuit of FIG. 9, and the dotted line "B'" shows a property of a circuit which has no the capacitor C1 and the inductors Lw1 and Lw2.

As shown in FIG. 11, although the passing S parameter S21 decreases at a high-frequency region, it is possible to cancel the amount of the decrease of the S parameter S21 by an increase of the input reflection S parameter S11. As a result, as shown in the solid "A'", it is possible to even the gain up to the high-frequency region.

Thus, according to the fourth embodiment, impedances of the capacitor of the parasite capacitor C1 and the inductances of the parasite inductors Lw1 and Lw2 are set so as to vibrate sympathetically at two different frequency in the used frequency band. Because of this, it is possible to broaden the frequency band, as compared with case which has no parasite capacitor C1 and parasite inductors Lw1 and Lw2.

In the Smith chart in FIG. 10, although two resonance points are provided in the used frequency band, there may be more than three parasite resonance points in the used frequency band.

Although an example mounting the resistor Rin for impedance conversion on the substrate has been explained in FIG. 8, the resistor Rin may be provided in the inside of the photo-diode PD, or in the inside of the trans-impedance amplifier 32. The resistor Rin may be a variable resistor, in order to enable a change of the resistance as the need arises.

If the resistor Rin is provided in the inside of the power supply pattern 21 of the photo-diode PD, it is unnecessary to change a design of the trans-impedance amplifier 32. Because of this, it is possible to reduce cost increase for design and manufacture.

Figure 12:
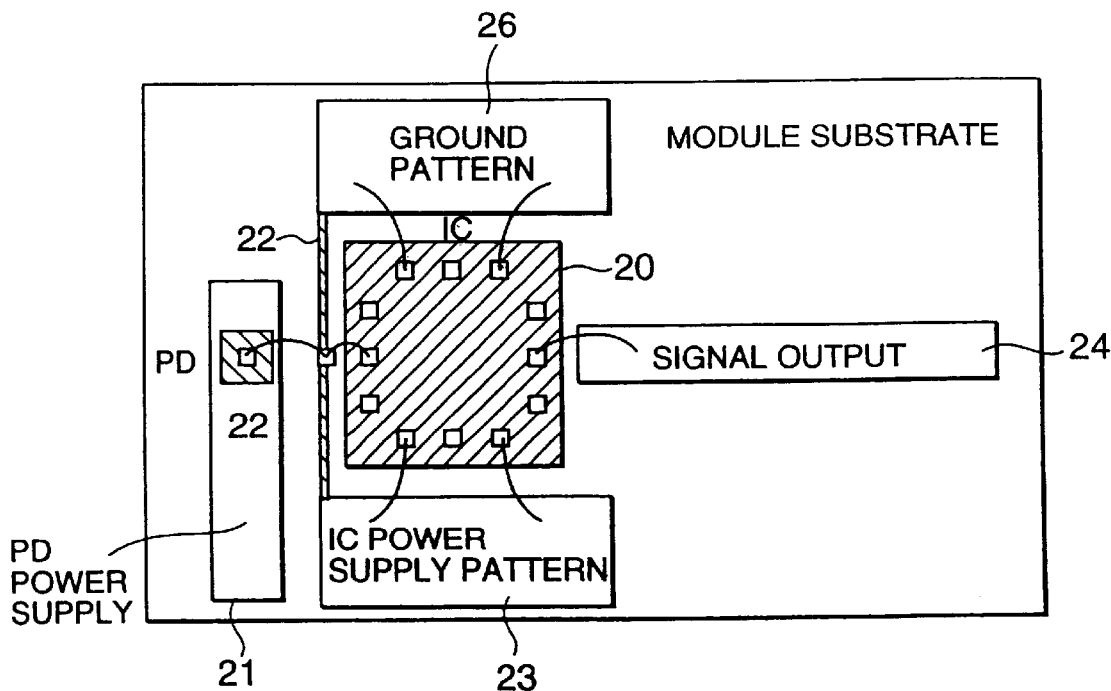
FIG. 12 is a layout diagram showing a condition mounting the circuit of FIG. 7 on a module substrate.
Figure 13:
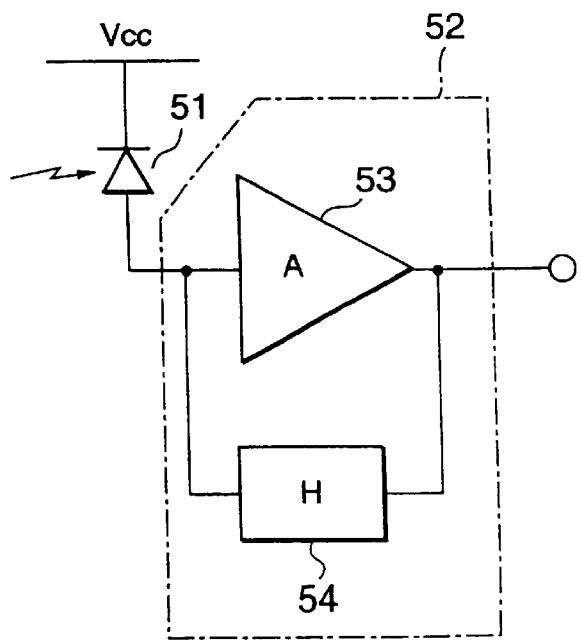
FIG. 13 is a block diagram showing a schematic configuration of a conventional optical receiving circuit.

FIG. 12 is a layout diagram showing an example mounting the circuit of FIG. 7 on the module substrate. One end of a narrow pattern 22 corresponding to the reflection coefficient setting circuit 3 is connected to an IC power supply pattern 23, and the other end is connected to the ground pattern 26.

If the patterns shown in FIG. 12 are formed in advance, by trimming portions of the narrow pattern 22 and the IC power supply pattern 23, it is possible to easily convert the patterns shown in FIG. 12 into the patterns shown in FIG. 8.

Circuit configurations of the amplifier 2 of FIG. 1 and the trans-impedance amplifier 32 of FIG. 9 are not limited to those shown in these diagrams. If circuits are fed back negatively, the circuit configurations are no matter.

The reflection coefficient setting circuit 3 shown in FIG. 1, FIG. 6, FIG. 7 and FIG. 9 may be constituted by using circuit elements besides the resistor. For example, a portion or all of the resistor of these diagrams may be replaced with a reactance circuit which includes inductance elements or capacitor elements connected in series or in parallel.

What is claimed is:

1. An optical receiving circuit, comprising:
   a photoelectric conversion element configured to output a current signal in accordance with a light receiving optical signal;
   a negative feedback type of an amplifier in which said current signal is inputted, said amplifier outputting a voltage in accordance with the current signal; and
   a reflection coefficient setting circuit configured to set an input reflection coefficient, said reflection coefficient setting circuit being provided between said photoelectric conversion element and said amplifier;
   wherein said reflection coefficient setting circuit minifies the input reflection coefficient at a sympathetic vibrating frequency of said amplifier.

2. The optical receiving circuit according to claim 1, wherein said reflection coefficient setting circuit is a resistor element connected between a terminal supplying a current and an input terminal of said amplifier.

3. The optical receiving circuit according to claim 1, wherein said reflection coefficient setting circuit is a resistor dividing circuit.

4. The optical receiving circuit according to claim 1, wherein a resistance of said reflection coefficient setting circuit is 50–200Ω.

5. The optical receiving circuit according to claim 1, wherein said reflection coefficient setting circuit is a reactance circuit constituted by an inductor element and a capacitor element.

6. The optical receiving circuit according to claim 1, wherein an input impedance of said amplifier is a sympathetic vibrating circuit in which an inductor element and a capacitor element are equivalently connected in parallel.

7. An optical receiving circuit, comprising:
   a photoelectric conversion element for outputting a current signal in accordance with a light receiving optical signal;
   a negative feedback type of an amplifier in which said current signal is inputted, said amplifier outputting a voltage in accordance with the current signal; and
   a reflection coefficient setting circuit for setting an input reflection coefficient, said reflection coefficient setting circuit being provided between said photoelectric conversion element and said amplifier;
   wherein said reflection coefficient setting circuit sets a reflection coefficient so that an input reflection coefficient becomes small when a frequency of an inputted current signal coincides with a minimum frequency of sympathetic vibrating frequencies.

8. The optical receiving circuit according to claim 7, wherein an impedance of said reflection coefficient setting circuit is set so that an absolute value of the input reflection coefficient at said sympathetic vibrating frequency becomes equal to or less than 0.3.

9. The optical receiving circuit according to claim 1, wherein a gain fluctuation of said amplifier for frequencies of the inputted current signal is evened, by setting small the absolute value of the input reflection coefficient at said sympathetic vibration frequency.

10. An optical receiving circuit, comprising:
    a photoelectric conversion element for outputting a current signal in accordance with a light receiving optical signal;
    a negative feedback type of an amplifier in which said current signal is inputted, said amplifier outputting a voltage in accordance with the current signal; and
    a reflection coefficient setting circuit for setting an input reflection coefficient, said reflection coefficient setting circuit being provided between said photoelectric conversion element and said amplifier;
    wherein said photoelectric conversion element and said reflection coefficient setting circuit are formed in the same semiconductor chip.

11. An optical receiving circuit, comprising:
    a photoelectric conversion element configured to output a current signal in accordance with a light receiving optical signal;
    a negative feedback type of an amplifier in which said current signal is inputted, said amplifier outputting a voltage in accordance with said current signal; and
    a reflection coefficient setting circuit configured to set an input reflection coefficient, said reflection coefficient setting circuit being provided between said photoelectric conversion element and said amplifier;
    wherein said reflection coefficient setting circuit minifies the input reflection coefficient at a sympathetic vibrating frequency and evens a frequency dependency of a gain of said amplifier.

12. The optical receiving circuit according to claim 11, wherein said reflection coefficient setting circuit is a resistor element connected between a terminal supplying a voltage and an input terminal of said amplifier.

13. The optical receiving circuit according to claim 11, wherein said reflection coefficient setting circuit is a resistor dividing circuit.

14. The optical receiving circuit according to claim 11, wherein said reflection coefficient setting circuit is a reactance circuit constituted by an inductor element and a capacitor element.

15. An optical receiving circuit, comprising:
    a photoelectric conversion element configured to output a current signal in accordance with a light receiving optical signal;
    a negative feedback type of amplifier in which said current signal is inputted, said amplifier outputting a voltage in accordance with said current signal;
    a reflection coefficient setting circuit configured to set an input reflection coefficient, said reflection coefficient setting circuit being provided between said photoelectric conversion element and said amplifier; and a plurality of bonding wires configured to connect between said photoelectric conversion element and said reflection coefficient setting circuit, and between said reflection coefficient setting circuit and said amplifier, respectively;

wherein said reflection coefficient setting circuit minifies the input reflection coefficient at a minimum frequency of sympathetic vibrating frequencies.

16. The optical receiving circuit according to claim 15, wherein a frequency higher than the minimum frequency of the sympathetic vibrating frequencies is generated by using capacitance connected in a parallel to said photoelectric conversion element and an inductance of said plurality of bonding wires.

17. The optical receiving circuit according to claim 15, wherein said reflection coefficient setting circuit generates a frequency higher than the minimum frequency of the sympathetic vibrating frequencies by adjusting a capacitance connected in a parallel to said photoelectric conversion element and an inductance of said plurality of bonding wires, so that a frequency dependency of a gain is evened and a frequency band is expanded.

18. The optical receiving circuit according to claim 1, wherein said photoelectric conversion element and said reflection coefficient setting circuit are formed in the same semiconductor chip.

19. The optical receiving circuit according to claim 1, wherein said reflection coefficient setting circuit sets a reflection coefficient so that an input reflection coefficient becomes small when a frequency of an inputted current signal coincides with a minimum frequency of sympathetic vibrating frequencies.

20. The optical receiving circuit according to claim 1, wherein an impedance of said reflection coefficient setting circuit is set so that an absolute value of the input reflection coefficient at said sympathetic vibrating frequency becomes equal to or less than 0.3.

\* \* \* \* \*